(12) United States Patent
Gupta et al.

(10) Patent No.: US 7,764,759 B2
(45) Date of Patent: Jul. 27, 2010

(54) LINEAR SAMPLE AND HOLD PHASE DETECTOR FOR CLOCKING CIRCUITS

(75) Inventors: Atul K. Gupta, Milton (CA); Wesley C. d'Haene, Burlington (CA); Rajiv K. Shukla, Burlington (CA)

(73) Assignee: Gennum Corporation (CA)

(*) Notice: Subject to any disclaimer, the term of this patent is extended or adjusted under 35 U.S.C. 154(b) by 1020 days.

(21) Appl. No.: 11/472,815

(22) Filed: Jun. 22, 2006

(65) Prior Publication Data

US 2007/0286321 A1 Dec. 13, 2007

Related U.S. Application Data

(60) Provisional application No. 60/813,145, filed on Jun. 13, 2006.

(51) Int. Cl.
G01R 25/00 (2006.01)
H03D 13/00 (2006.01)
H04L 7/00 (2006.01)

(52) U.S. Cl. .............. 375/355; 327/3; 327/5; 327/7; 327/9; 327/12

(58) Field of Classification Search ........ 375/326, 375/371
See application file for complete search history.

(56) References Cited

U.S. PATENT DOCUMENTS

| | | | | |
|---|---|---|---|---|
| 4,392,113 A | * | 7/1983 | Jackson | 331/14 |
| 4,490,688 A | * | 12/1984 | Borras et al. | 331/1 A |
| 4,513,256 A | * | 4/1985 | Kurihara et al. | 331/4 |
| 4,857,866 A | * | 8/1989 | Tateishi | 331/1 A |
| 4,864,252 A | * | 9/1989 | Heck | 331/1 A |
| 5,057,793 A | * | 10/1991 | Cowley et al. | 331/1 A |
| 5,373,255 A | * | 12/1994 | Bray et al. | 331/1 A |
| 5,920,214 A | * | 7/1999 | Lee et al. | 327/147 |
| 5,920,233 A | * | 7/1999 | Denny | 331/14 |
| 6,034,554 A | | 3/2000 | Francis et al. | |
| 6,377,081 B1 | * | 4/2002 | Tateyama | 327/12 |
| 6,496,555 B1 | * | 12/2002 | Soda | 375/376 |
| 6,590,457 B2 | * | 7/2003 | Schrodinger | 331/1 A |
| 6,593,817 B1 | * | 7/2003 | Magazz' et al. | 331/17 |
| 6,614,314 B2 | * | 9/2003 | d'Haene et al. | 331/1 A |

(Continued)

Primary Examiner—Chieh M Fan
Assistant Examiner—Santiago Garcia (57) ABSTRACT

Linear sample and hold phase detectors are disclosed herein. An example phase detector is coupled to an input data signal and a recovered clock signal and includes a linear phase difference generator circuit and a sample and hold circuit. The linear phase difference generator includes a first input coupled to the input data signal and a second input coupled to the recovered clock signal and outputs a first phase difference signal indicative of the phase difference between the input data signal and the recovered clock signal relative to a rising edge of the input data signal and a second phase difference signal indicative of the phase difference between the input data signal and the recovered clock signal relative to a falling edge of the input data signal. The sample and hold circuit is coupled to the first and second phase difference output signals and samples the voltage levels thereof in response to a first transition of the input data signal and holds the sampled voltage levels until a second transition of the input data signal. Novel clocking circuits using the linear sample and hold phase detector, as well as other types of linear phase detectors, are also disclosed herein in which a gain block non-linearizes the linear phase difference information output from the linear phase detector circuits.

33 Claims, 11 Drawing Sheets

U.S. PATENT DOCUMENTS

| | | | |
|---|---|---|---|
| 6,628,112 B2* | 9/2003 | Pisipaty | 324/76.53 |
| 6,700,944 B1* | 3/2004 | Chlipala et al. | 375/376 |
| 6,704,383 B2* | 3/2004 | Lee et al. | 375/376 |
| 6,774,731 B2* | 8/2004 | Magazzu et al. | 331/17 |
| 6,775,084 B1* | 8/2004 | Ozdemir et al. | 360/55 |
| 6,778,024 B2* | 8/2004 | Gupta et al. | 331/16 |
| 6,900,676 B1* | 5/2005 | Tamura | 327/156 |
| 6,956,923 B1* | 10/2005 | Younis et al. | 375/375 |
| 7,035,253 B2* | 4/2006 | Kuhlmann et al. | 370/356 |
| 7,042,252 B2* | 5/2006 | Galloway et al. | 327/16 |
| 7,049,869 B2* | 5/2006 | d'Haene et al. | 327/165 |
| 7,205,852 B2* | 4/2007 | Perrott | 331/25 |
| 7,292,670 B2* | 11/2007 | Gupta et al. | 375/371 |
| 7,315,601 B2* | 1/2008 | Fontaine et al. | 375/375 |
| 7,375,591 B2* | 5/2008 | Fu et al. | 331/1 A |
| 7,400,561 B2* | 7/2008 | Serrano et al. | 369/47.28 |
| 7,415,064 B2* | 8/2008 | Sivadas et al. | 375/229 |
| 7,421,053 B1* | 9/2008 | Li et al. | 375/376 |
| 7,436,921 B1* | 10/2008 | Mulbrook et al. | 375/376 |
| 2002/0039020 A1* | 4/2002 | Bellaouar et al. | 324/76.58 |
| 2002/0136342 A1* | 9/2002 | Lee et al. | 375/376 |
| 2003/0053534 A1* | 3/2003 | Sivadas et al. | 375/229 |
| 2003/0102928 A1* | 6/2003 | d'Haene et al. | 331/172 |
| 2003/0197536 A1* | 10/2003 | Issa et al. | 327/158 |
| 2004/0095194 A1* | 5/2004 | Gupta et al. | 331/16 |
| 2004/0179642 A1* | 9/2004 | Fontaine et al. | 375/376 |
| 2005/0031065 A1* | 2/2005 | Gupta et al. | 375/371 |
| 2005/0046456 A1* | 3/2005 | d'Haene et al. | 327/165 |
| 2005/0047500 A1* | 3/2005 | Gupta et al. | 375/232 |
| 2005/0052252 A1* | 3/2005 | Galibois | 331/25 |
| 2005/0146359 A1* | 7/2005 | Tsai | 327/3 |
| 2005/0237086 A1* | 10/2005 | Galloway et al. | 327/16 |
| 2005/0254566 A1* | 11/2005 | Sivadas et al. | 375/229 |
| 2005/0254567 A1* | 11/2005 | Sivadas et al. | 375/229 |
| 2006/0017471 A1* | 1/2006 | Nguyen | 327/3 |
| 2006/0203948 A1* | 9/2006 | Lin | 375/375 |
| 2007/0036257 A1* | 2/2007 | Hu | 375/376 |
| 2007/0286321 A1* | 12/2007 | Gupta et al. | 375/375 |
| 2008/0297217 A1* | 12/2008 | Welland et al. | 327/159 |
| 2009/0074123 A1* | 3/2009 | Hsueh et al. | 375/360 |

* cited by examiner

LINEAR SAMPLE AND HOLD PHASE DETECTOR FOR CLOCKING CIRCUITS

CROSS-REFERENCE TO RELATED APPLICATIONS

This application claims priority to U.S. Provisional Application 60/813,145, filed on Jun. 13, 2006, the entirety of which is hereby incorporated by reference.

BACKGROUND

1. Technical Field

The technology described in this patent application is generally directed to the field of phase detectors and clocking circuits that use such detectors. More specifically, a linear sample and hold phase detector is provided that is particularly useful in clock and data recovery ("CDR") circuits as well as phase-locked loop ("PLL") circuits. Novel CDR and PLL architectures are also described herein.

2. Description of the Related Art

Clock and data recovery circuits (CDRs) are typically used in data communications systems to extract and recover a clock from an input data stream. The recovered clock is then used to re-clock (or retime) the input data stream in order to provide an output data signal having reduced jitter.

Many communications standards require that the overall jitter generation of a given communication link is lower than some maximum value. These standards often require that the jitter generation is met in a frequency band that is both above and below the loop bandwidth of the CDR circuit. Meeting these requirements in systems that use stressful data patterns (i.e., CDR pathological patterns) that occur for long periods of time (i.e., within the CDR loop bandwidth) is difficult with conventional CDRs. Because the recovered clock signal is extracted from the input data signal, the phase of this recovered clock is susceptible to variation based on the input data jitter present and the bit pattern of the incoming data.

Figure 1:
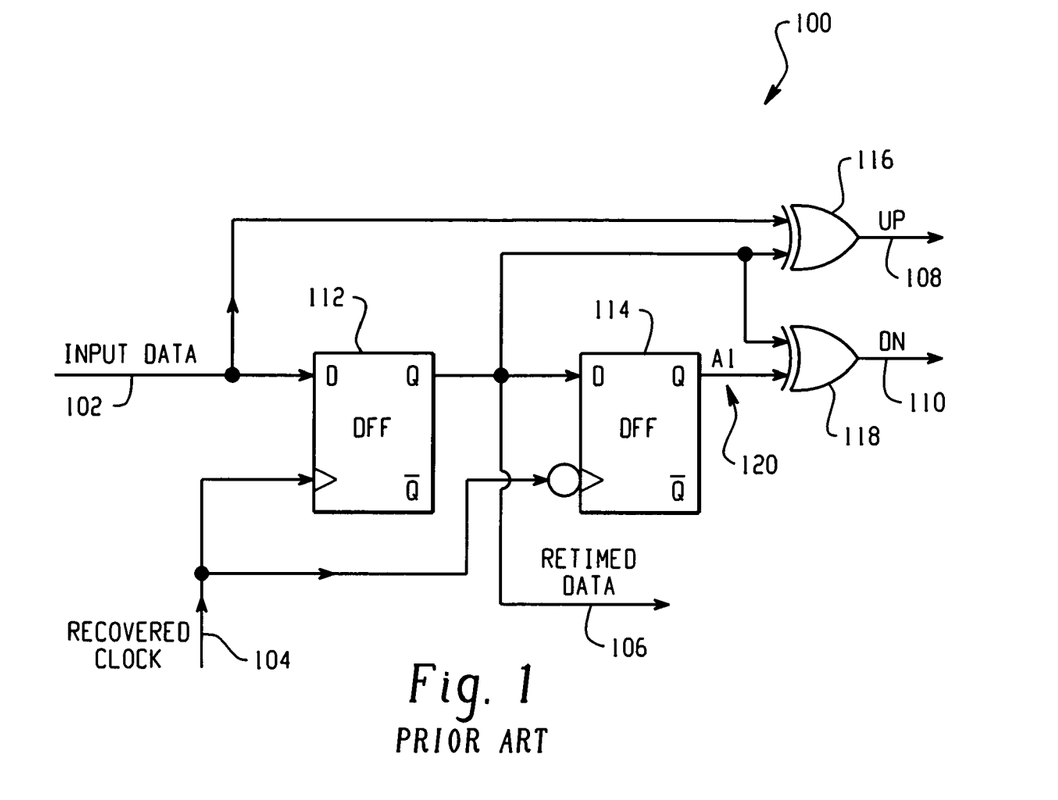
FIG. 1 is a block diagram of a prior art linear phase detector.

FIG. 1 is a block diagram of a prior art linear phase detector 100. This device includes a pair of D-type flip-flops 112, 114, and a pair of exclusive-OR gates 116, 118. The input data stream 102 is coupled to the data input of a first D-type flip-flop 112, and is also coupled to one input of a first exclusive-OR gate 116. The recovered clock signal 104, which is generated in another part of the circuit with which the phase detector 100 may be cooperating, is coupled to the clock inputs of the two flip-flops 112, 114. The phase of the recovered clock signal 104 is inverted at the clock input to the second D-type flip-flop 114. A retimed data signal 106 is output from the first D-type flip-flop 112 at its Q output. This same retimed data signal is also coupled to the other input of the first exclusive-OR gate 116 and to one input of the second exclusive-OR gate 118. The Q output of the second D-type flip-flop 114 (A1) is coupled to the other input of the second exclusive-OR gate 118.

Operationally, the two D-type flip-flops 112, 114 are cascaded to sample the incoming input data 102. The first flip-flop 112 samples the input data 102 on one recovered clock edge 104, and the second flip-flop 114 samples the retimed data signal 106 on the other recovered clock edge 104 (inverted). The input data 102 is compared with the retimed data signal 106 using the first exclusive-OR gate 116 to generate an UP pulse output 108. The retimed data signal 106 is compared with the delayed retimed data signal (at node A1) 120 using the second exclusive-OR gate 118 to generate a DN pulse output 110. The DN output pulse 110 width will remain one-half clock cycle wide. The UP output pulse 108 width will either increase or decrease in width depending on the phase difference between the input data signal 102 and the recovered clock signal 104. In the case of ideal phase alignment between these two signals 102/104, the UP output pulse 108 width will be the same as the DN pulse 110 width (i.e., one-half clock width).

Figure 2A:
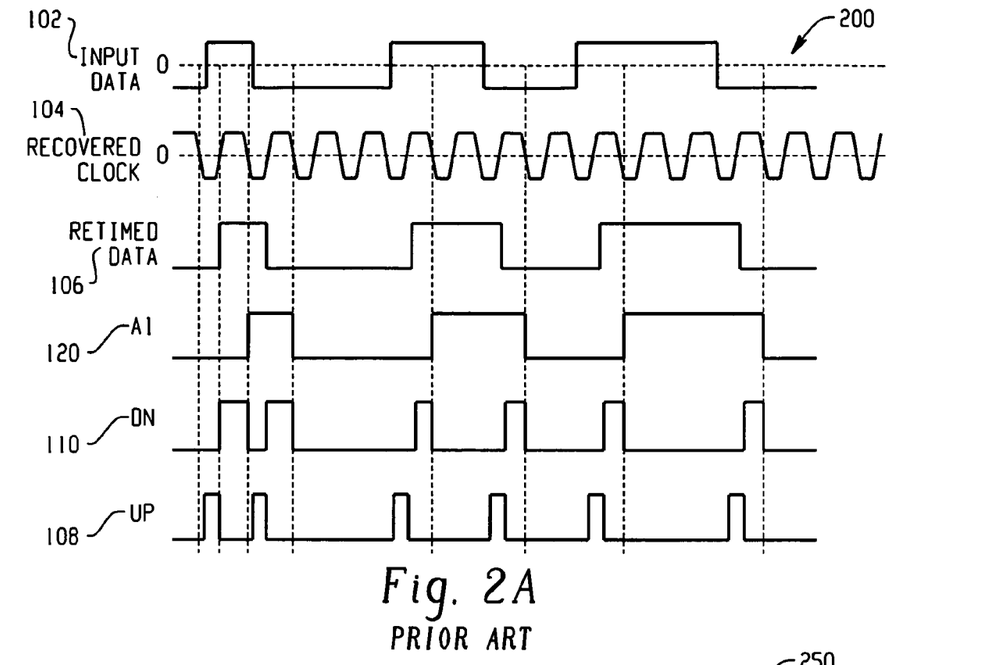
FIG. 2A is a timing diagram showing the operation of the prior art linear phase detector of FIG. 1 in which the recovered clock signal is early with respect to the input data signal.

FIG. 2A is a timing diagram 200 showing the operation of the prior art linear phase detector of FIG. 1 in which the recovered clock signal 104 is early with respect to the input data signal 102. Also shown in FIG. 2A are the retimed data 106, the node A1 signal 120, and the up and down pulse signals 108/110 from the pair of exclusive-OR gates 116, 118. As demonstrated in this figure, because the recovered clock signal 104 is early with respect to the input data signal 102—meaning that it crosses the zero line prior to the rising edge of the input data signal 102—then so too is the retimed data signal 106. As a result, the pulses generated at the UP output 108 shrink compared to the pulses generated at the DN output 110. In a typical CDR circuit using such a prior art phase detector, this will cause the recovered clock phase to be corrected by moving it late.

Figure 2B:
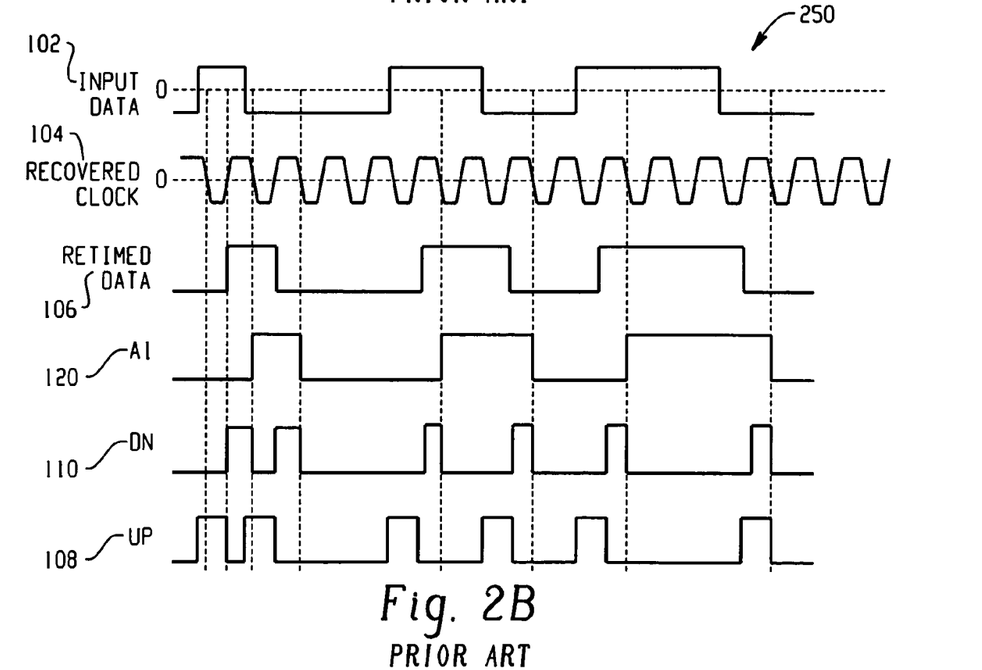
FIG. 2B is a timing diagram showing the operation of the prior art linear phase detector of FIG. 1 in which the recovered clock signal is late with respect to the input data signal.

FIG. 2B is a timing diagram 250 showing the operation of the prior art linear phase detector of FIG. 1 in which the recovered clock signal 104 is late with respect to the input data signal 102. The same signals shown in FIG. 2A are also shown in FIG. 2B. As demonstrated in this figure, because the recovered clock signal 104 is late with respect to the input data signal 102—meaning that it crosses the zero line after the rising edge of the input data signal 102—then so too is the retimed data signal 106. As a result, the pulses generated at the UP output 108 widen in comparison to the pulses generated at the DN output 110. In a typical CDR circuit using such a prior art phase detector, this will cause the recovered clock phase to be corrected by moving it early.

Figure 3:
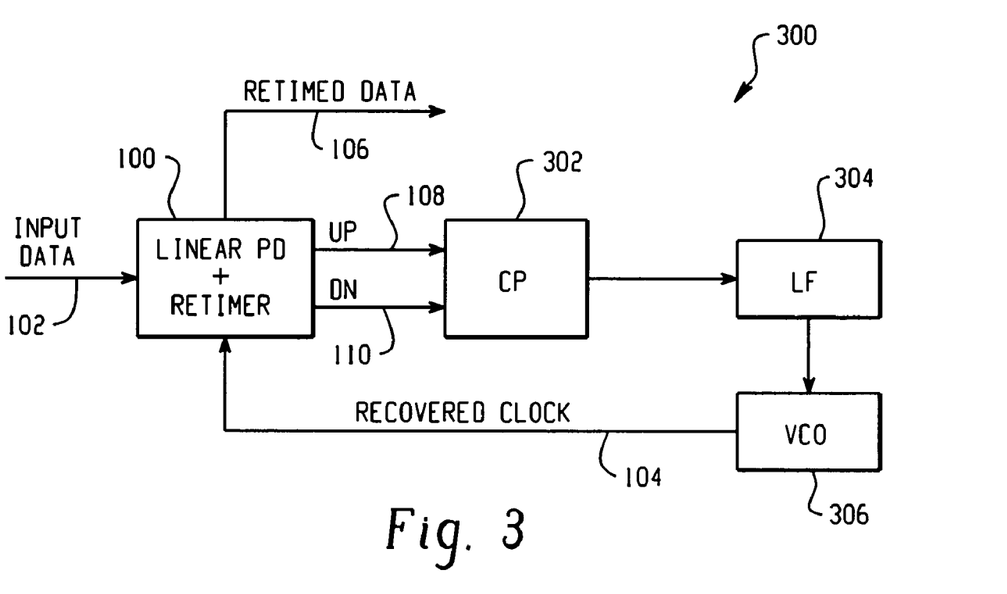
FIG. 3 is a block diagram of a prior art clock and data recovery circuit utilizing the linear phase detector of FIG. 1.

FIG. 3 is a block diagram of a prior art clock and data recovery circuit 300 utilizing the linear phase detector 100 of FIG. 1. This circuit 300 includes, in addition to the linear phase detector 100, a charge pump circuit 302, a loop filter 304, and a voltage controlled oscillator 306 ("VCO"). The input data signal 102 is coupled to the linear phase detector and retiming circuit 100, which also receives the recovered clock signal 104 from the VCO 306 and generates the retimed data signal 106. As described above, the linear phase detector 100 produces UP and DN pulses 108/110 whose widths are representative of the relationship between input data edges and the recovered clock signal 104. These pulses are integrated and filtered by the charge pump 302 and loop filter 304. The filtered signal, in turn, drives a control port of the voltage controlled oscillator (VCO). The VCO output is the recovered clock signal 104 that feeds into the phase detector circuit 100.

The circuitry described above will typically tri-state (i.e., a high impedance output state that is neither a logic 1 or a logic 0) when there are no input data edges present at its input 102. Consequentially, the charge pump 302 and loop filter 304 will not charge up or down. During this time, any perturbations in the recovered clock signal 104 caused by, for example, supply noise, VCO phase noise, charge pump leakage, or other sources of perturbations, will not be immediately corrected by the CDR loop. This failure to respond when in tri-state mode adds to the overall jitter observed in the recovered clock signal 104, thus degrading the performance of the circuit against certain standards.

The prior art phase detector shown in FIG. 1 is also sensitive to input data transition density as well as component mismatches and non-ideal behavior. When data transition density decreases, so does the loop bandwidth in a CDR circuit such as shown in FIG. 3. This decrease in the loop bandwidth increases the CDR susceptibility to various noise sources or VCO frequency/phase drift. When long enough run lengths of certain input pattern types occur, this can cause the CDR to have different steady state recovered clock phases based upon the input data transition densities. This limitation of the prior art circuitry may further add to the overall jitter generation observed in the recovered clock signal 104.

SUMMARY

An example linear sample and hold phase detector is coupled to an input data signal and a recovered clock signal and includes a linear phase difference generator circuit and a sample and hold circuit. The linear phase difference generator includes a first input coupled to the input data signal and a second input coupled to the recovered clock signal and outputs a first phase difference signal indicative of the phase difference between the input data signal and the recovered clock signal relative to a rising edge of the input data signal and a second phase difference signal indicative of the phase difference between the input data signal and the recovered clock signal relative to a falling edge of the input data signal. The sample and hold circuit is coupled to the first and second phase difference output signals and samples the voltage levels thereof in response to a first transition of the input data signal and holds the sampled voltage levels until a second transition of the input data signal. Novel clocking circuits using the linear sample and hold phase detector, as well as other types of linear phase detectors, are also disclosed herein in which a gain block non-linearizes the linear phase difference information output from the linear phase detector circuits.

DETAILED DESCRIPTION

Figure 4:
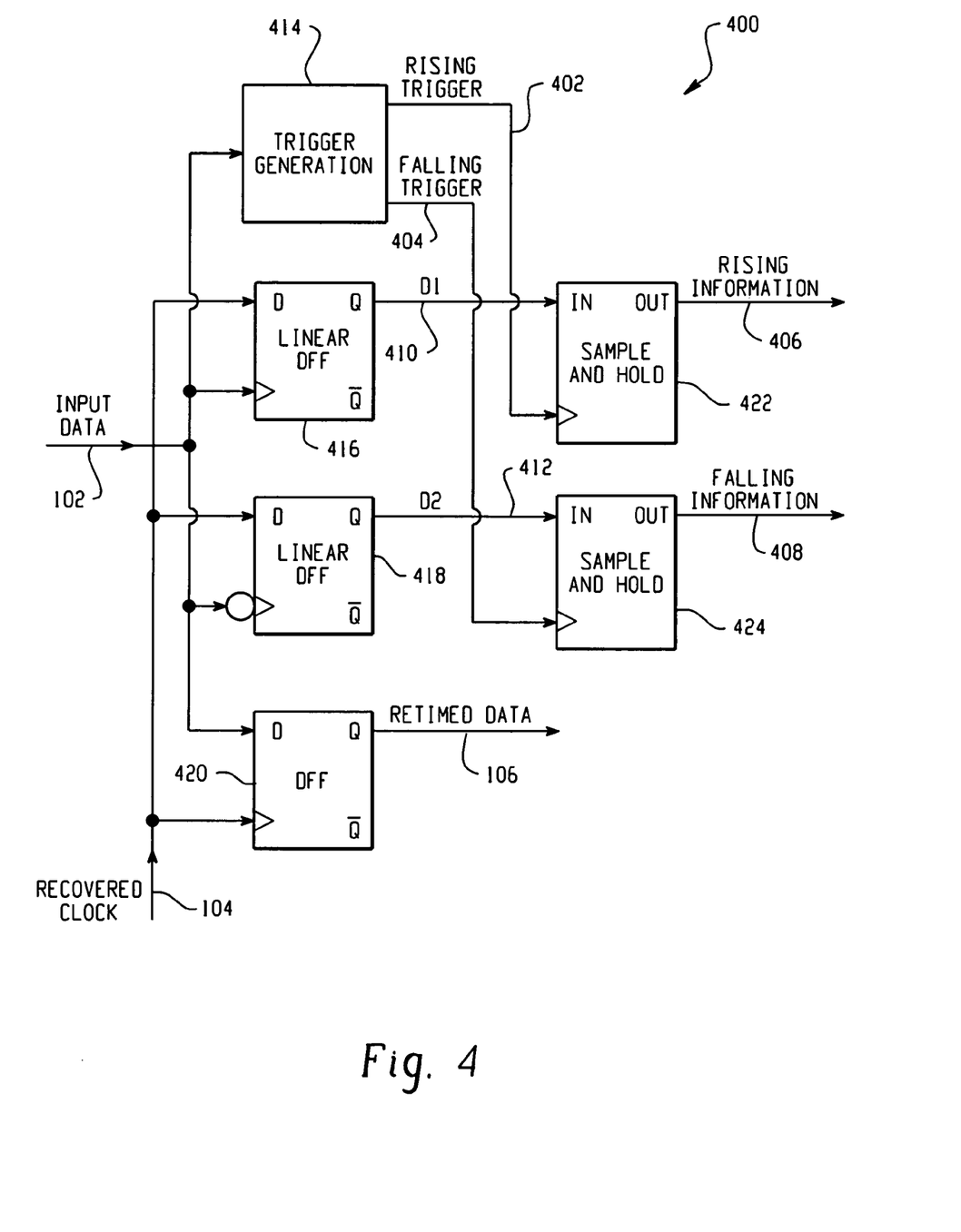
FIG. 4 is a block diagram of an example linear sample and hold phase detector.

Turning now to the remaining drawing figures, FIG. 4 is a block diagram of an example linear sample-and-hold phase detector 400. This example circuit includes a D-type flip-flop 420, a pair of linear D-type flip-flops 416, 418, a trigger generation circuit 414, and a pair of sample-and-hold circuits 422, 424. The input data signal 102 is coupled to the trigger generation circuit 414, the data input of the D-type flip-flop 420, and the clock inputs of the pair of linear D-type flip flops 416/418 (with one of the clock inputs being inverted in phase relative to the other clock input). Also coupled to the D-type flip-flops is the recovered clock signal 104. This signal 104 is coupled to the data inputs of the two linear D-type flip-flops 416/418 and to the clock input of the D-type flip-flop 420.

Output from the D-type flip-flop 420 is the retimed data signal 106. The Q outputs of the pair of linear D-type flip-flops (D1 410, and D2 412) are coupled, respectively, to the two inputs of the pair of sample-and-hold circuits 422, 424. These sample-and-hold circuits are clocked by a pair of trigger signals 402/404 generated from the trigger generation circuit 414—a rising trigger signal 402, which clocks the first sample-and-hold circuit 422 coupled to the D1 signal, and a second trigger signal 404, which clocks the second sample-and-hold circuit 424 coupled to the D2 signal. Rising information 406 is output from the first sample-and-hold circuit 422 and falling information 408 is output from the second sample-and-hold circuit 424.

Operationally, the input data signal 102 is used to sample the recovered clock signal 104 with both rising and falling data edges via the pair of linear D-type flip-flops 416/418. The linear D-type flip-flop 416/418 is designed to generate a voltage output at D1 or D2 that is proportional to the phase difference between an input data edge on the input data signal 102 and the recovered clock signal 104. The linear D-type flip-flop 416/418 is distinguished from the regular D-type flip-flop 420 in that instead of producing a digital logic output signal (i.e., a logic 0 or a logic 1 voltage level), it produces an analog output voltage that is proportional to the phase difference between its input data node and the input clock node. Although a linear D-type flip-flop 416/418 is shown in this example circuit 400, other types of circuitry for producing a signal indicative of the relative phase difference between the input data signal 102 and the recovered clock signal 104 could also be utilized herewith.

The trigger generation circuit 414 is operable to generate two outputs, the rising trigger output 402 and the falling trigger output 404. The rising trigger output 402 provides a pulse when rising data edges occur on the input data signal 102 and is concurrent with the phase difference information generated at D1 410. The rising trigger signal 402 enables the first sample-and-hold circuit 422 to track the input voltage at D1 410 when there is a positive transition (rising edge) on the input data signal 102. When the rising trigger signal 402 goes low, the first sample-and-hold circuit 422 will store the voltage level on D1 410 that was sampled at the input of the sample-and-hold circuit 422. Similarly, the falling trigger output 404 from the trigger generation circuitry 414 provides a pulse when falling data edges occur on the input data signal 102 and is concurrent with the phase difference information generated at D2 412. The falling trigger signal 404 enables the second sample-and-hold circuit 424 to track the input voltage at D2 412 when there is a negative transition (falling edge) on the input data signal 102. When the falling trigger signal 404 goes low, the second sample-and-hold circuit 424 will store the voltage level on D2 412 that was sampled at the input of the sample-and-hold circuit 424.

Figure 5A:
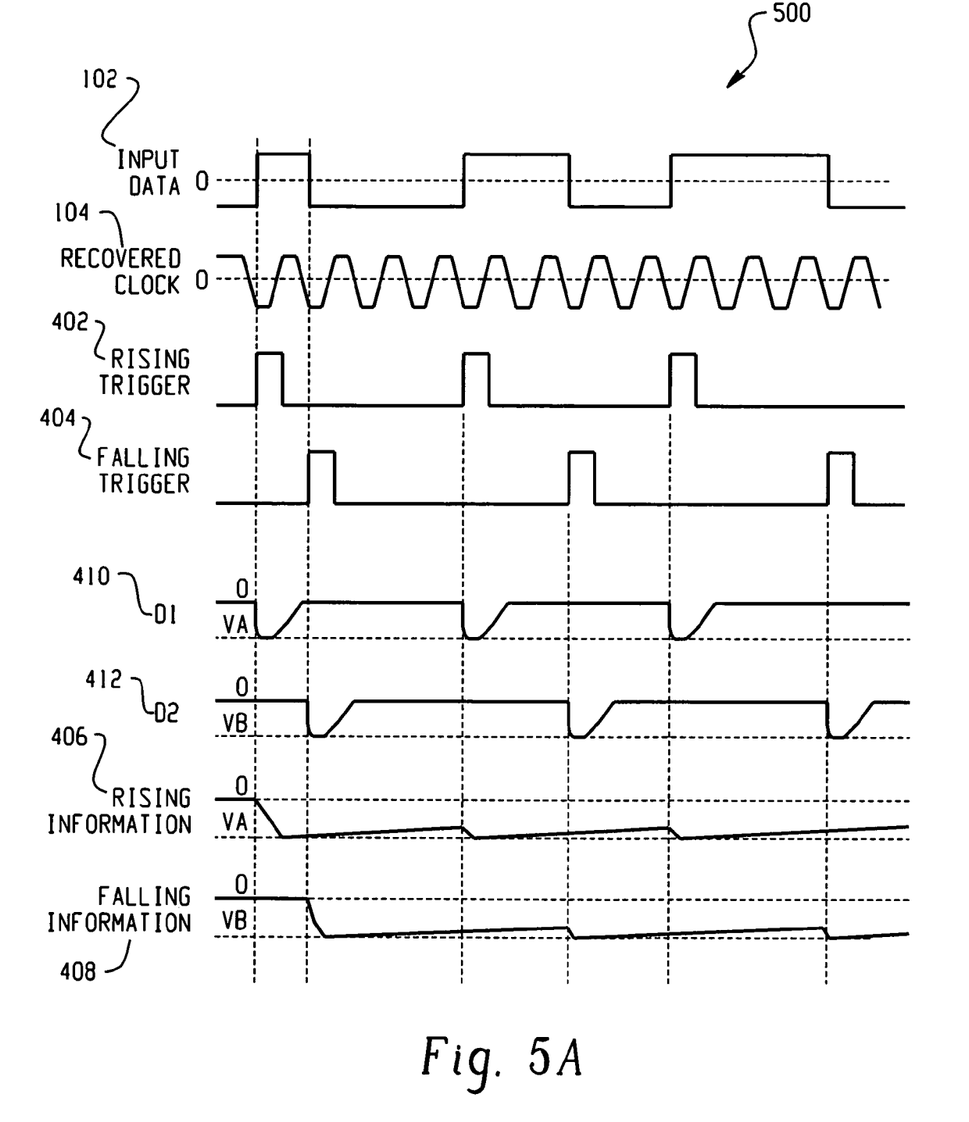
FIG. 5A is a timing diagram showing the operation of the example linear sample and hold phase detector of FIG. 4 in which the recovered clock signal is early with respect to the input data signal.

FIG. 5A is a timing diagram 500 showing the operation of the example linear sample and hold phase detector of FIG. 4 in which the recovered clock signal 104 is early with respect to the input data signal 102. Also shown in FIG. 5A are the rising trigger signal 402, the falling trigger signal 404, the D1 node voltage 410 output from the first linear D-type flip-flop 416, the D2 node voltage 412 output from the second linear D-type flip-flop 418, the rising information signal 406, and the falling information signal 408.

When the recovered clock signal 104 is early with respect to the input data signal 102, as shown in this figure, the data edges of the input data signal 102 will sample the recovered clock signal 104 at a point below the zero crossing point of the recovered clock 104 (i.e., a negative voltage). Thus, a negative voltage VA will appear after a rising input data edge at the output node D1 410 of the first linear D-type flip-flop 416. The voltage VA on node D1 410 is representative of the degree to which the recovered clock signal 104 is early with respect to the input data signal 102. The same operation applies for the negative voltage VB at node D2 412 of the second linear D-type flip-flop 418 in reaction to the falling edge of the input data signal 102. As the voltages VA and VB are generated at nodes D1 and D2, the rising and falling triggers 402/404 are also generated in response to the rising and falling edges of the input data signal 102. These trigger signals 402, 404 cause the pair of sample-and-hold circuits 422/424 to store the voltages VA and VB, which are output at the rising information and falling information nodes 406/408.

Figure 5B:
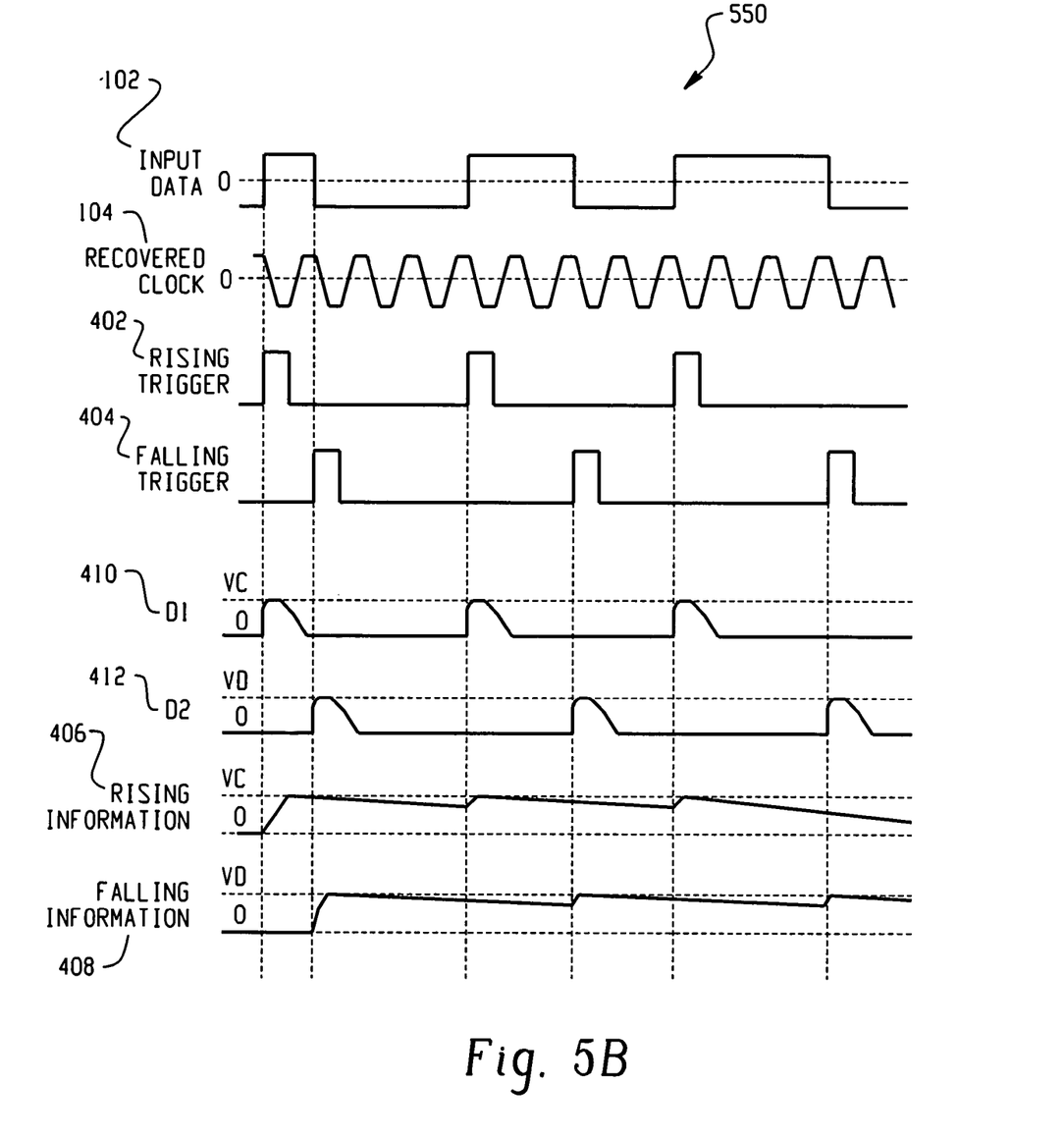
FIG. 5B is a timing diagram showing the operation of the example linear sample and hold phase detector of FIG. 4 in which the recovered clock signal is late with respect to the input data signal.

FIG. 5B is a timing diagram 550 showing the operation of the example linear sample and hold phase detector of FIG. 4 in which the recovered clock signal 104 is late with respect to the input data signal 102. In this scenario, the data edges of the input data signal 102 will sample the recovered clock signal 104 at a point above the zero crossing point of the recovered clock 104 (i.e., a positive voltage). Thus, a positive voltage VC will appear at node D1 after a rising data edge 102. The voltage VC is representative of the degree to which the recovered clock signal 104 is late with respect to the input data signal 102. The same operation applies for the positive voltage VD at node D2. As the voltages VC and VD are generated at nodes D1 and D2, the rising and falling triggers 402/404 are also generated in response to the rising and falling edges of the input data signal 102. These trigger signals 402, 404 cause the pair of sample-and-hold circuits 422/424 to store the voltages VC and VD, which are output at the rising information and falling information nodes 406/408.

As shown in these timing diagrams, the rising and falling outputs 406/408 of the linear sample-and-hold phase detector 400 are not digital pulses whose widths vary with the phase difference between the two compared signals, but instead are characterized by an analog type of pulse whose peak varies with the measured phase difference between the two signals. Moreover, unlike the prior art phase detector shown in FIGS. 1, 2A and 2B, the linear sample-and-hold phase detector outputs 406/408 do not tri-state in the absence of an input data signal, but rather hold the last measured phase difference so that a circuit using the phase detector 400 may continue to correct for phase perturbations or anomalies even in the absence of an input data signal.

Figure 6:
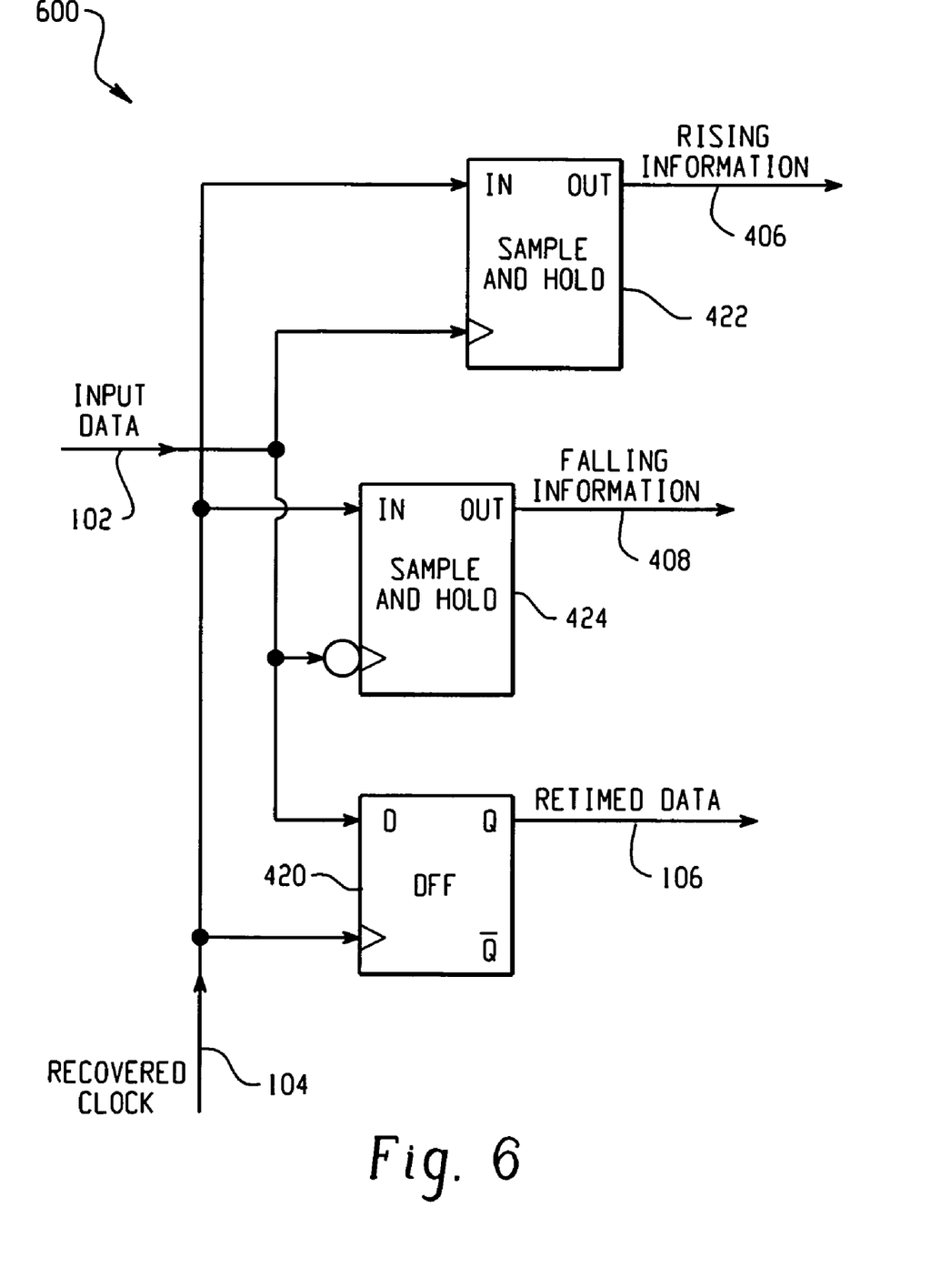
FIG. 6 is a block diagram of another example linear sample and hold phase detector.

FIG. 6 is a block diagram of another example linear sample-and-hold phase detector 600. This example circuit 600 includes the D-type flip-flop 420 from FIG. 4, as well as the pair of sample-and-hold circuits 422, 424 for generating the rising information 406 and falling information 408. This example circuit does not include the linear D-type flip-flops 416, 418, or the trigger generation circuit 414 shown in FIG. 4. In this circuit 600, the input data signal 102 is coupled to the data input node of the D-type flip-flop 420, just as in FIG. 4, which is clocked with the recovered clock signal 104 in order to generate the retimed data signal 106. Unlike FIG. 4, however, in this circuit 600, the input data signal is directly coupled to the clock input nodes of the sample-and-hold circuits 422, 424, with the later circuit 424 having an inverted clock input. The recovered clock signal 104 is then coupled to the data input nodes of the two sample-and-hold circuits 422, 424.

Operationally, the circuitry shown in FIG. 6 functions in a similar manner to the circuitry shown in FIG. 4. Each of the sample-and-hold circuits 422, 424 operate by sampling their input voltage (the recovered clock signal 104) during a data edge event on the input data signal 102. The first sample-and-hold circuit 422 samples on the rising edge of the input data signal 102 and generates the rising information signal 406, and the second sample-and-hold circuit 424 samples on the falling edge of the input data signal 102 and generates the falling information signal 408.

In another example linear sample-and-hold phase detector, multiple stages of sample-and-hold circuits 422/424 can be cascaded together. For example, the outputs of sample-and-hold circuits 422/424 could each be fed as inputs to another set of sample-and-hold circuits whose outputs would be the rising and falling information signals 406/408. Additional sets of sample-and-hold circuits could also be added to this cascaded configuration, with each circuit being preferably clocked by the input data signal 102.

Figure 7:
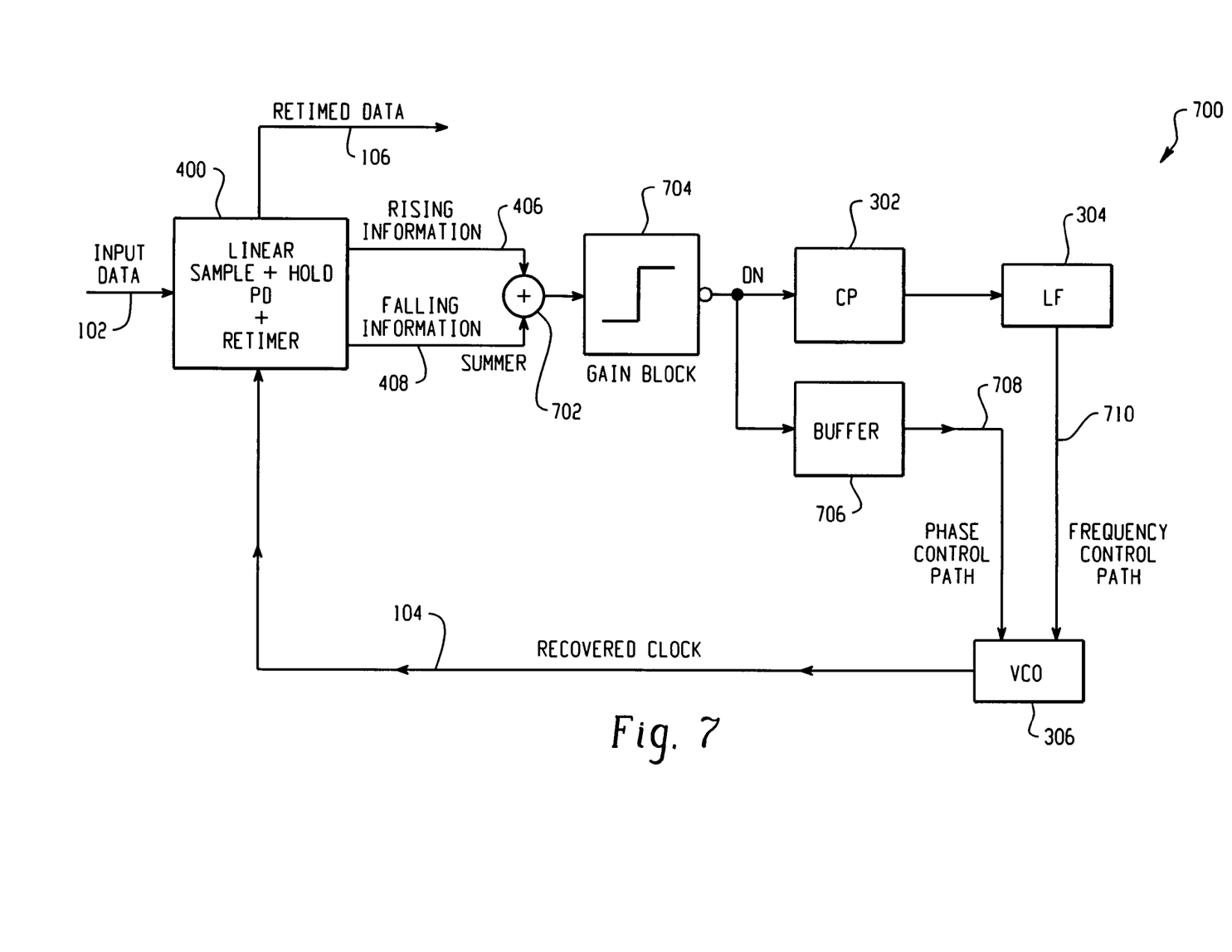
FIG. 7 is a block diagram of an example clock and data recovery circuit utilizing a linear sample and hold phase detector.

FIG. 7 is a block diagram of an example clock and data recovery circuit 700 utilizing a linear sample and hold phase detector 400/600. This example circuit includes, in addition to the phase detector 400/600, a summation block 702, a gain block 704, a buffer 706, a charge pump circuit 302, a loop filter 304, and a voltage controlled oscillator 306 having a phase control input and a frequency control input.

The input data signal 102 is coupled to the linear sample-and-hold phase detector and retiming circuit 400/600, which also receives the recovered clock signal 104 from the VCO 306 and generates the retimed data signal 106. As described previously, the linear sample-and-hold phase detector 400/600 outputs rising information 406 and falling information 408. These two signals 406/408 are coupled to the summation block 702, the output of which is then provided to the gain block 704. The gain block 704 generates a non-linear output signal DN, which is coupled to the charge pump circuit 302 and the buffer 706. The output 708 of the buffer 706 is coupled to the phase control input of the VCO 306, and the output of the charge pump 302 and loop filter 304 (signal 710) is coupled to the frequency control input of the VCO 306.

Operationally, input data 102 is applied to the linear sample-and-hold phase detector and re-timer circuit 400/600. As described above, the example phase detector 400/600 shown in FIGS. 4/6 is operable to generate linear phase difference information between the input data signal 102 and the recovered clock signal 104. This phase difference information is generated separately for rising data edges and falling data edges, respectively, as signals 406 and 408. These phase difference signals 406/408 are then coupled to the summing block 702, where this information is combined into a single signal. By combining the phase difference information from both edges of the input data signal, which may include an averaging function or a weighted averaging function, the effective phase difference between the recovered clock signal and the input data signal can typically be reduced over implementations in which phase difference information from only a single edge transition is utilized. The combined phase difference information from the summer output is then non-linearized by passing it through the limiting gain block 704.

The non-linear output (DN) of the gain block 704 is a digital signal representing the phase information from the phase detector 400/600. This digital signal (DN) then drives the charge pump circuit 302 and the buffer circuit 706. The charge pump 302, in turn, drives the loop filter circuit 304, which in turn drives a port of the voltage controlled oscillator circuit 306 dedicated to frequency control. This path (CP-LF-VCO) is responsible for the frequency control of the CDR circuit 700. The buffer circuit 706 drives a second port of the voltage controlled oscillator dedicated to phase control. This path (Buffer-VCO) is responsible for the phase control of the CDR circuit 700. The VCO output signal (i.e., the recovered clock 104) then feeds into the phase detector circuit 400/600 to complete the loop.

The example low-jitter CDR circuit shown in FIG. 7 provides several advantages over previous CDR circuits. First, the limiting gain element 704 added in the CDR loop between the phase detector 400/600 output and the charge pump 302 effectively converts the CDR loop from a linear system to a non-linear system. This is advantageous in certain applications because it allows the CDR to be more effective in correcting for phase perturbations that would otherwise show up in the recovered clock signal 104 due to supply noise and VCO phase noise, for example. This non-linear CDR is able to correct for these types of impairments almost instantaneously. Second, by using a linear sample-and-hold phase detector, an example of which is shown in FIG. 4, the CDR circuit will not go into a tri-state mode. In so doing, even in the absence of data transitions on the input data signal 102, the circuit 700 will hold the last phase difference measurement that was made between the input data signal 102 and the recovered clock signal 104. As a result of this operation, the phase detector 400/600 (and hence the circuit 700) has almost no sensitivity to data edge transition density on the input data signal 102. This circuit 700 is also less sensitive to non-ideal component behavior and component mismatches.

Figure 8:
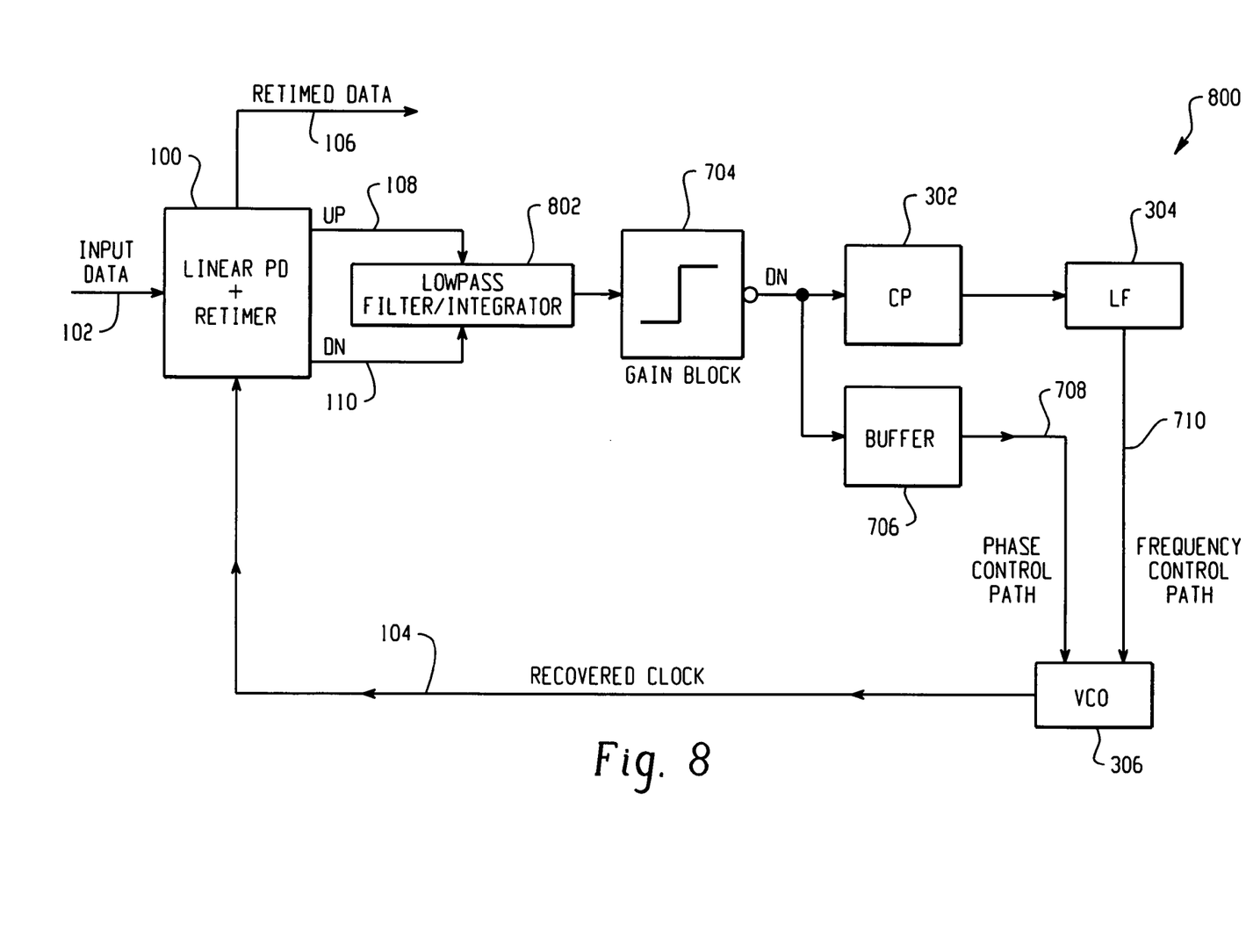
FIG. 8 is a block diagram of another example clock and data recovery circuit utilizing a linear phase detector.

FIG. 8 is a block diagram of another example clock and data recovery circuit 800 utilizing a linear phase detector 100. This circuit is identical to FIG. 7, except that a linear phase detector 100 is substituted for the linear sample-and-hold phase detector 400/600, and a lowpass filter/integrator 802 is substituted for the summation block 702. The limiting gain block 704 remains in this circuit, as it continues to play a beneficial role in reducing jitter generation.

Figure 9:
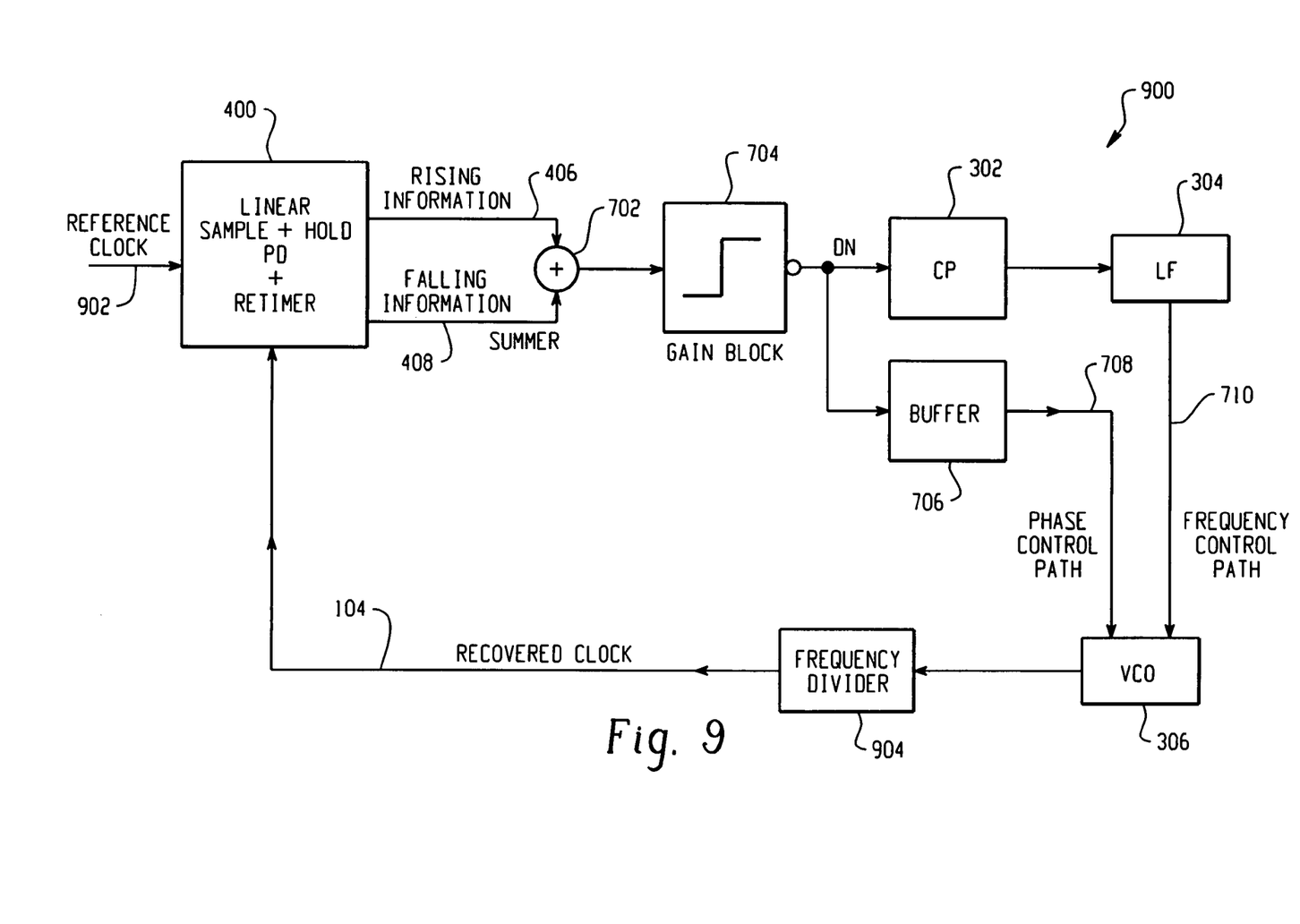
FIG. 9 is a block diagram of an example phase-locked loop circuit utilizing a linear sample and hold phase detector.

FIG. 9 is a block diagram of an example phase-locked loop circuit 900 utilizing a linear sample and hold phase detector 400/600. This circuit is identical to FIG. 7, except that a reference clock signal 902 is provided as the input to the linear sample-and-hold phase detector 400/600, and a frequency divider 904 is provided in the feedback path from the VCO 306 to the recovered clock input 104 of the phase detector 400/600. This circuit 900 implements a clock multiplier phase-locked loop function.

Figure 10:
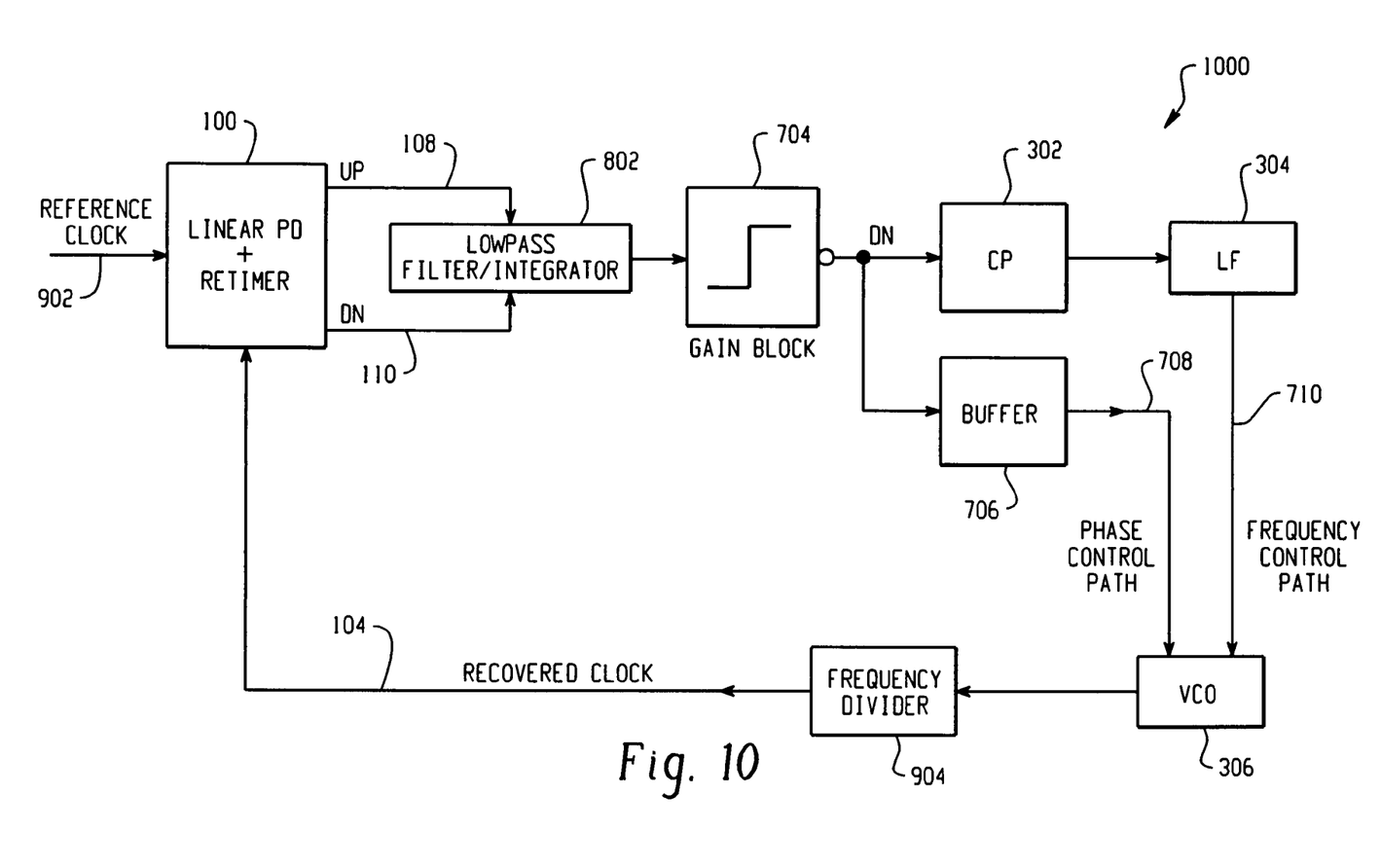
FIG. 10 is a block diagram of another example phase-locked loop circuit utilizing a linear phase detector.

FIG. 10 is a block diagram of another example phase-locked loop circuit 1000 utilizing a linear phase detector 100. This circuit is identical to FIG. 8, except that the reference clock signal 902 is provided as the input to the linear phase detector 100, and a frequency divider 904 is provided in the feedback path from the VCO 306 to the recovered clock input 104 of the phase detector 100.

This written description uses examples to disclose the invention, including the best mode, and also to enable a person skilled in the art to make and use the invention. The patentable scope of the invention may include other examples that occur to those skilled in the art.

The invention claimed is:

1. A clock and data recovery circuit coupled to an input data signal, comprising:

a phase detector, comprising:

a linear phase difference generator circuit having a first input coupled to the input data signal and a second input coupled to a recovered clock signal, the linear phase difference generator circuit having a first phase difference output and a second phase different output, the first phase difference output including a first analog signal that is proportional to the phase difference between the input data signal and the recovered clock signal relative to a rising edge of the input data signal, the second phase difference output including a second analog signal that is proportional to the phase difference between the input data signal and the recovered clock signal relative to a falling edge of the input data signal; and an analog sample and hold circuit coupled to the first and second phase difference outputs of the linear phase difference generator for sampling the analog voltage levels of the first and second phase difference outputs in response to a first transition of the input data signal and for holding the sampled analog voltage levels until a second transition of the input data signal, the sampled analog voltage levels respectively providing linear rising and falling information signals;

an averaging circuit that sums the linear rising and falling information signals into a single linear information signal indicative of the relative phase differences between both the rising and falling edges of the input data signal and the recovered clock signal;

a gain block that generates a non-linear control signal from the single linear information signal; and a voltage controlled oscillator coupled to the non-linear control signal for generating the recovered clock signal.

2. The clock and data recovery circuit of claim 1, the phase detector further comprising:

a trigger generation circuit coupled to the input data signal for generating sampling trigger signals for causing the sample and hold circuit to sample the analog voltage levels of the first and second phase difference outputs.

3. The clock and data recovery circuit of claim 1, the phase detector further comprising:

a circuit coupled to the input data signal and the recovered clock signal for generating a retimed data signal.

4. The clock and data recovery circuit of claim 1, wherein the linear phase difference generator comprises a pair of linear D-type flip-flops.

5. The clock and data recovery circuit of claim 4, wherein the pair of linear D-type flip-flops each include a input data node and a input clock node, wherein the recovered clock signal is coupled to the input data node of each of the pair of linear D-type flip-flops, the input data signal is coupled to one of the input clock nodes of the pair of linear D-type flip flops, and an inverted version of the input data signal is coupled to the other one of the input clock nodes of the pair of linear D-type flip flops.

6. The clock and data recovery circuit of claim 1, wherein the sample and hold circuit comprises a first and second sample and hold circuit, the first sample and hold circuit being coupled to the first phase difference output and configured to sample and hold the voltage level of the first phase difference output on a rising edge of the input data signal, and the second sample and hold circuit being coupled to the second phase difference output and configured to sample and hold the voltage level of the second phase difference output on a falling edge of the input data signal.

7. The clock and data recovery circuit of claim 6, further comprising:
a trigger generation circuit coupled to the input data signal for generating sampling trigger signals including a rising trigger signal coupled to the first sample and hold circuit and a falling trigger signal coupled to the second sample and hold circuit.

8. A clock and data recovery circuit coupled to an input data signal, comprising:
a phase detector, comprising:
circuitry for receiving an input data signal and a recovered clock signal and for generating a first analog phase difference signal indicating the phase difference between a rising edge of the input data signal and the recovered clock signal and a second analog phase difference signal indicating the phase difference between a falling edge of the input data signal and the recovered clock signal; and
circuitry for sampling and holding the first and second analog phase difference signals to provide analog up and down information signals;
a filter/integrator circuit coupled to the linear phase detector that combines the analog up and down information signals into a single analog information signal indicative of the relative phase differences between both the rising and falling edges of the input data signal and the recovered clock signal;
a gain block that generates a non-linear control signal from the single analog information signal; and
a voltage controlled oscillator coupled to the non-linear control signal for generating the recovered clock signal.

9. The clock and data recovery circuit of claim 8, the linear phase detector further comprising:
circuitry for generating rising and falling trigger signals responsive to the rising and falling edges of the input data signal, the rising and falling trigger signals being coupled to the circuitry for sampling and holding the first and second analog phase difference signals and operating to trigger the sampling and holding of the first and second analog phase difference signals.

10. The clock and data recovery circuit of claim 8, the linear phase detector further comprising:
circuitry for retiming the input data signal in response to the recovered clock signal.

11. The clock and data recovery circuit of claim 8, wherein the circuitry for receiving includes a first and second linear phase difference generator circuit, the first linear phase difference generator circuit being coupled to the recovered clock signal and the input data signal and generating the first analog phase difference signal, and the second linear phase difference generator circuit being coupled to the recovered clock signal an inverted version of the input data signal and generating the second analog phase difference signal.

12. The clock and data recovery circuit of claim 11, wherein the first and second linear phase difference generator circuits are linear D-type flip flops.

13. The clock and data recovery circuit of claim 8, wherein the circuit for sampling and holding comprises a first sample and hold circuit coupled to the first analog phase difference signal and a second sample and hold circuit coupled to the second analog phase difference signal.

14. The clock and data recovery circuit of claim 13, wherein the first sample and hold circuit is triggered on a rising edge of the input data signal and the second sample and hold circuit is triggered on a falling edge of the input data signal.

15. A clock and data recovery circuit coupled to an input data signal, comprising:
a phase detector, comprising:
a pair of linear flip flops configured to sample the recovered clock signal on a rising and a falling edge of the input data signal and to generate a first and a second analog phase difference output voltage;
wherein the first analog phase difference output voltage is proportional to the phase difference between the recovered clock signal and the rising edge of the input data signal, and the second analog phase difference output voltage is proportional to the phase difference between the recovered clock signal and the falling edge of the input data signal; and
a pair of sample and hold circuits configured to sample the first and second analog phase difference output voltages in response to a first transition of the input data signal and to generate linear rising and falling information signals there from which are held until a second transition of the input data signal;
an averaging circuit that sums the linear rising and falling information signals into a single linear information signal indicative of the relative phase differences between both the rising and falling edges of the input data signal and the recovered clock signal;
a gain block that generates a non-linear control signal from the single linear information signal; and
a voltage controlled oscillator coupled to the non-linear control signal for generating the recovered clock signal.

16. The clock and data recovery circuit of claim 15, the phase detector further comprising:
a non-linear flip flop coupled to the input data signal and the recovered clock signal for generating a retimed data signal.

17. The clock and data recovery circuit of claim 15, the phase detector further comprising:
a trigger generator for receiving the input data signal and for generating a rising trigger signal and a falling trigger signal; wherein the rising trigger signal causes one of the pair of sample and hold circuits to generate the rising information signal and the falling trigger signal causes the other of the pair of sample and hold circuits to generate the falling information signal.

18. A clock and data recovery circuit coupled to an input data signal, comprising:
a linear sample and hold phase detector coupled to the input data signal and a recovered clock signal for generating linear rising and falling information signals which are analog signals that are indicative of the relative phase differences between the rising and falling edges of the input data signal and the recovered clock signal;
a gain block coupled to the linear rising and falling information signals for generating a non-linear control signal;
a voltage controlled oscillator coupled to the non-linear control signal for generating the recovered clock signal; and
an averaging circuit coupled between the linear sample and hold phase detector and the gain block for summing the linear rising and falling information signals into a single linear information signal indicative of the relative phase differences between both the rising and falling edges of the input data signal and the recovered clock signal.

19. The clock and data recovery circuit of claim 18, wherein the linear sample and hold phase detector includes a retiming circuit for generating a retimed data signal from the input data signal and the recovered clock signal.

20. The clock and data recovery circuit of claim 18, further comprising:
a charge pump and loop filter circuit coupled to the non-linear control signal for generating a frequency control signal; and
a buffer coupled to the non-linear control signal for generating a phase control signal;
wherein the frequency control signal and the phase control signal are coupled to the voltage controlled oscillator and are used to generate the recovered clock signal.

21. The clock and data recovery circuit of claim 18, further comprising:
a charge pump and loop filter circuit coupled to the non-linear control signal for generating a VCO control signal;
wherein the VCO control signal is coupled to the voltage controlled oscillator for generating the recovered clock signal.

22. A clock and data recovery circuit coupled to an input data signal, comprising:
a linear phase detector coupled to the input data signal and a recovered clock signal for generating analog up and down information signals indicative of the relative phase differences between the rising and falling edges of the input data signal and the recovered clock signal;
a gain block coupled to the analog up and down information signals for generating a non-linear control signal;
a voltage controlled oscillator coupled to the non-linear control signal for generating the recovered clock signal; and
a filter/integrator circuit coupled between the linear phase detector and the gain block for combining the analog up and down information signals into a single analog information signal indicative of the relative phase differences between both the rising and falling edges of the input data signal and the recovered clock signal.

23. The clock and data recovery circuit of claim 22, wherein the linear phase detector includes a retiming circuit for generating a retimed data signal from the input data signal and the recovered clock signal.

24. The clock and data recovery circuit of claim 22, further comprising:
a charge pump and loop filter circuit coupled to the non-linear control signal for generating a frequency control signal; and
a buffer coupled to the non-linear control signal for generating a phase control signal;
wherein the frequency control signal and the phase control signal are coupled to the voltage controlled oscillator and are used to generate the recovered clock signal.

25. The clock and data recovery circuit of claim 22, further comprising:
a charge pump and loop filter circuit coupled to the non-linear control signal for generating a VCO control signal;
wherein the VCO control signal is coupled to the voltage controlled oscillator for generating the recovered clock signal.

26. A phase locked loop circuit coupled to an input reference clock, comprising:
a linear sample and hold phase detector coupled to the input reference clock and a recovered clock signal for generating linear rising and falling information signals which are analog signals that are indicative of the relative phase differences between the rising and falling edges of the input reference clock and the recovered clock signal;
a gain block coupled to the linear rising and falling information signals for generating a non-linear control signal;
a voltage controlled oscillator coupled to the non-linear control signal for generating the recovered clock signal; and
an averaging circuit coupled between the linear sample and hold phase detector and the gain block for summing the linear rising and falling information signals into a single linear information signal indicative of the relative phase differences between both the rising and falling edges of the input reference clock and the recovered clock signal.

27. The phase locked loop circuit of claim 26, further comprising:
a charge pump and loop filter circuit coupled to the non-linear control signal for generating a frequency control signal; and
a buffer coupled to the non-linear control signal for generating a phase control signal:
wherein the frequency control signal and the phase control signal are coupled to the voltage controlled oscillator and are used to generate the recovered clock signal.

28. The phase locked loop circuit of claim 26, further comprising:
a frequency divider coupled to an output of the voltage controlled oscillator, wherein the recovered clock signal is a frequency divided version of the output of the voltage controlled oscillator.

29. The phase locked loop circuit of claim 26, further comprising:
a charge pump and loop filter circuit coupled to the non-linear control signal for generating a VCO control signal;
wherein the VCO control signal is coupled to the voltage controlled oscillator for generating the recovered clock signal.

30. A phase locked loop circuit coupled to a reference clock signal, comprising:
a linear phase detector coupled to the reference clock signal and a recovered clock signal for generating analog up and down information signals indicative of the relative phase differences between the rising and falling edges of the reference clock signal and the recovered clock signal;
a gain block coupled to the analog up and down information signals for generating a non-linear control signal;
a voltage controlled oscillator coupled to the non-linear control signal for generating the recovered clock signal; and
a filter/integrator circuit coupled between the linear phase detector and the gain block for combining the analog up and down information signals into a single analog information signal indicative of the relative phase differences between both the rising and falling edges of the reference clock signal and the recovered clock signal.

31. The phase locked loop circuit of claim 30, further comprising:
a charge pump and loop filter circuit coupled to the non-linear control signal for generating a frequency control signal; and
a buffer coupled to the non-linear control signal for generating a phase control signal;

wherein the frequency control signal and the phase control signal are coupled to the voltage controlled oscillator and are used to generate the recovered clock signal.

32. The phase locked loop circuit of claim 30, further comprising:

a frequency divider coupled to an output of the voltage controlled oscillator, wherein the recovered clock signal is a frequency divided version of the output of the voltage controlled oscillator.

33. The phase locked loop circuit of claim 30, further comprising:

a charge pump and loop filter circuit coupled to the non-linear control signal for generating a VCO control signal;

wherein the VCO control signal is coupled to the voltage controlled oscillator for generating the recovered clock signal.

\* \* \* \* \*